(12) United States Patent
Wang et al.

(10) Patent No.: US 9,803,971 B2
(45) Date of Patent: Oct. 31, 2017

(54) PROXIMITY DETECTION VIA MAGNETIC RESONANCE COUPLING

(75) Inventors: Minglei Wang, Shanghai (CN); Xue Yang, Arcadia, CA (US); Xingang Guo, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 895 days.

(21) Appl. No.: 13/977,560

(22) PCT Filed: Dec. 28, 2011

(86) PCT No.: PCT/US2011/067602
§ 371 (c)(1),
(2), (4) Date: Mar. 21, 2014

(87) PCT Pub. No.: WO2013/100971
PCT Pub. Date: Jul. 4, 2013

(65) Prior Publication Data
US 2014/0197830 A1    Jul. 17, 2014

(51) Int. Cl.
*G01R 33/20* (2006.01)
*G01B 7/14* (2006.01)
(Continued)

(52) U.S. Cl.
CPC ............... *G01B 7/14* (2013.01); *G01R 33/20* (2013.01); *H04B 5/0012* (2013.01); *H04B 5/0043* (2013.01); *H04W 8/005* (2013.01)

(58) Field of Classification Search
CPC ......... G01B 7/14; H04W 8/005; G01R 33/20; H04B 5/0012; H04B 5/0043
See application file for complete search history.

(56) References Cited

U.S. PATENT DOCUMENTS 7,045,996 B2    5/2006 Lyon et al.
7,391,214 B2 *  6/2008 Adachi ................. G01R 33/34
                                            324/318
(Continued)

FOREIGN PATENT DOCUMENTS

WO    2013/100971 A1    7/2013

OTHER PUBLICATIONS

International Preliminary Report on Patentability and Written Opinion received for PCT Patent Application No. PCT/US2011/067602, dated Jul. 10, 2014, 5 Pages.
(Continued)

*Primary Examiner* — Dixomara Vargas
(74) *Attorney, Agent, or Firm* — Schiff Hardin LLP

(57) ABSTRACT

A magnetic resonance technology is used to implement front and back proximity sensing capability for wireless devices such as a laptap device. For example, a high quality (Q) factor coil antenna may be embedded in a display, such as a liquid crystal display, of a first laptap device to detect other wireless devices (e.g., a second laptap) that are within coupling distance of the first laptap device. In this example, the second laptap device induces a sine wave signal to the first laptap device if the second laptap device is physically located at backside of the first laptap device. Otherwise, the second laptap device may induce a cosine wave signal to the first laptap device if the second laptap device is physically located at the front side of the first laptap device.

14 Claims, 4 Drawing Sheets

(51) Int. Cl.
*H04W 8/00* (2009.01)
*H04B 5/00* (2006.01)

(56) References Cited

U.S. PATENT DOCUMENTS

| | | | |
|---|---|---|---|
| 7,761,100 B2 | 7/2010 | Anderson | |
| 8,195,271 B2 * | 6/2012 | Rahn | A61B 6/12 |
| | | | 378/4 |
| 9,268,003 B2 * | 2/2016 | Griffin | G01R 33/288 |
| 9,433,387 B2 * | 9/2016 | Ahn | A61B 6/04 |
| 9,526,434 B2 * | 12/2016 | Harlev | A61B 5/0422 |
| 9,571,974 B2 * | 2/2017 | Choi | H04W 4/023 |
| 2010/0109903 A1 | 5/2010 | Carrick | |
| 2010/0253532 A1 | 10/2010 | Pernisek et al. | |
| 2011/0012727 A1 | 1/2011 | Pance et al. | |

OTHER PUBLICATIONS

International Search Report and Written Opinion Received for PCT Patent Application No. PCT/US2011/067602, dated Aug. 31, 2012, 8 pages.

* cited by examiner

PROXIMITY DETECTION VIA MAGNETIC RESONANCE COUPLING

BACKGROUND

Proximity detection between wireless devices (e.g., laptop devices) may be used to establish initial wireless communications between the wireless devices. For example, in a classroom group discussion, a first laptop device may be surrounded by a second laptop device, a third laptop device, and so on. The first laptop device may detect the second laptop device, or the third laptop device etc. that are physically located on the left side or at the right side of the first laptop device; however, the first laptop device may not recognize presence nor bearing location of the second laptop device, or the third laptop device etc. that are physically located either at the front side or at the backside of the first laptop device.

Proximity detection may be based upon WiFi signals generated by the wireless devices. For example, received signal strength from the WiFi signals may be used to determine presence of the wireless devices. In this example, the received signal strength still fails to solve the problem described above.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Overview

Figure 1:
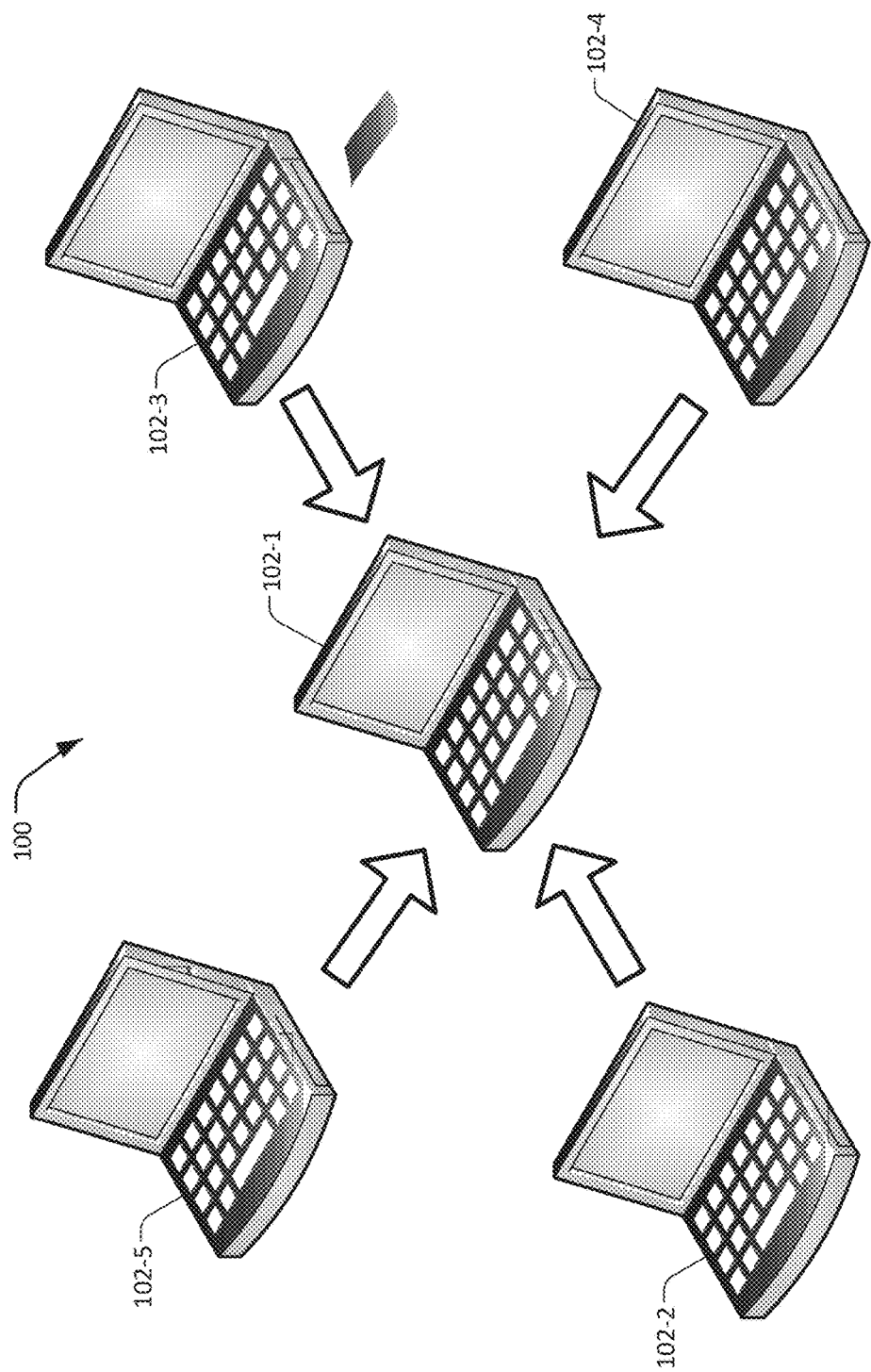
FIG. 1 is a diagram illustrating an example system implementing proximity detection via magnetic resonance coupling.

A magnetic resonance technology is used to implement front and back proximity sensing capability for wireless devices such as a laptop device. For example, a high quality (Q) factor coil antenna may be embedded at a display, such as a liquid crystal display (LCD) of a first laptop device to detect the other wireless devices (e.g., a second laptop) that may located at the front or back portion of the proximity sensing first laptop device. In this example, the second laptop device induces a sine wave signal to the first laptop device if the second laptop device is physically located at the backside of the first laptop device. Otherwise, the second laptop device may induce a cosine wave signal to the first laptop device if the second laptop device is physically located at the front side of the first laptop device.

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

Unless specifically stated otherwise, as apparent from the following discussions, it is appreciated that throughout the specification discussions utilizing terms such as "processing," "computing," "calculating." "determining." or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, or transmission devices. The terms "a" or "an", as used herein, are defined as one, or more than one. The term plurality, as used herein, is defined as two, or more than two. The term another, as used herein, is defined as, at least a second or more. The terms including and/or having, as used herein, are defined as, but not limited to, comprising. The term coupled as used herein, is defined as operably connected in any desired form for example, mechanically, electronically, digitally, directly, by software, by hardware and the like.

Some embodiments may be used in conjunction with various devices and systems, for example, a video device, an audio device, an audio-video (A/V) device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a display, a flat panel display, a Personal Media Player (PMP), a digital video camera (DVC), a digital audio player, a speaker, an audio receiver, an audio amplifier, a data source, a data sink, a Digital Still camera (DSC), a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless AP, a wired or wireless router, a wired or wireless modem, a wired or wireless network, a wireless area network, a Wireless Video Are Network (WVAN), a Local Area Network (LAN), a WLAN, a PAN, a WPAN, devices and/or networks operating in accordance with existing WirelessHD™ and/or Wireless-Gigabit-Alliance (WGA) specifications and/or future versions and/or derivatives thereof, devices and/or networks operating in accordance with existing IEEE 802.11 (IEEE 802.11-2007: Wireless LAN Medium Access Control (MAC) and Physical Layer (PHY) Specifications) standards and amendments, 802.11ad ("the IEEE 802.11 standards"), IEEE 802.16 standards, and/or future versions and/or derivatives thereof, units and/or devices which are part of the above networks, one way and/or two-way radio communication systems, cellular radio-telephone communication systems, Wireless- Display (WiDi) device, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, a Wireless Application Protocol (WAP) device, or the like.

Some embodiments may be used in conjunction with one or more types of wireless communication signals and/or systems, for example, Radio Frequency (RF), Wi-Fi, Wi-Max, Ultra-Wideband (UWB), or the like. Other embodiments may be used in various other devices, systems and/or networks.

Some embodiments may be used in conjunction with suitable limited-range or short-range wireless communication networks, for example, "piconets", e.g., a wireless area network, a WVAN, a WPAN, and the like.

Example System

FIG. 1 shows a system-level overview of an example system environment 100 for implementing proximity detection via magnetic resonance coupling. In an implementation, a wireless device 102-1 may include a proximity sensing hardware (e.g., high quality (Q) factor coil antenna) to detect other wireless devices 102 (i.e., wireless devices 102-2 and 102-3) that are located within close proximity of the wireless device 102-1. For example, the wireless device 102-2 may be located at the back portion of the wireless device 102-1. In this example, the wireless device 102-1 may detect the presence and bearing location (i.e., direction) of the wireless device 102-2 through magnetic resonance coupling implemented by the wireless device 102-1. The magnetic resonance coupling may include electrical resonance induced upon the wireless device 102-1 when the wireless device 102-2 is physically located within close proximity (i.e., within coupling distance) of the wireless device 102-1.

Similarly, a wireless device 102-3 may be located at front portion of the wireless device 102-1. The wireless device 102-1 may detect the location and presence of the wireless device 102-3 by processing currents induced by electromagnetic field emitted at the wireless device 102-3. In an implementation, wireless devices 102-4 and 102-5, which are located at the right side and left side respectively of the wireless device 102-1 may be detected using WiFi signals. For example, received signal strength indicator (RSSI) may be used as the basis for locating presence and location of the wireless devices 102-4 and 102-5. The RSSI may include power level indication received by a separate antenna of the wireless device 102-1. In other implementations, the wireless devices 102-1, 102-3, 102-4, and 102-5 may be configured to have proximity sensing capabilities similar to the wireless device 102-1. The wireless device 102 may include various devices, such as laptop computers, tablet computers, smart phones, etc. Furthermore, as discussed above, the wireless device 102 is to be understood to include other devices.

Example Wireless Device

Figure 2:
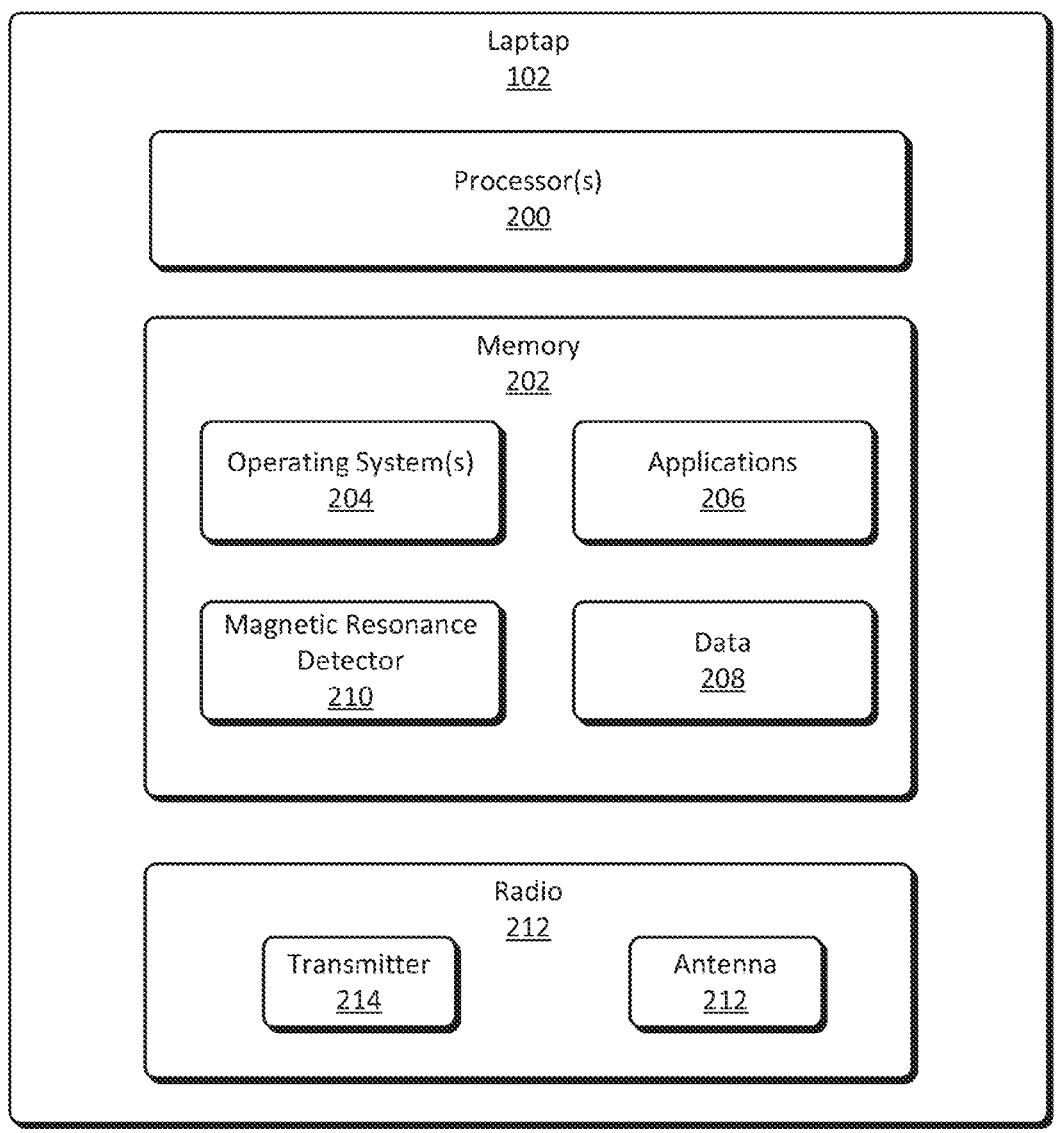
FIG. 2 is a diagram illustrating an example wireless device that implements proximity detection via magnetic resonance coupling.

FIG. 2 is an example wireless device 102 that implements proximity detection via magnetic resonance coupling. Wireless device 102 includes one or more processors, processor(s) 200. Processor(s) 200 may be a single processing unit or a number of processing units, all of which may include single or multiple computing units or multiple cores. The processor(s) 200 may be implemented as one or more microprocessors, microcomputers, microcontrollers, digital signal processors, central processing units, state machines, logic circuitries, and/or any devices that manipulate signals based on operational instructions. Among other capabilities, the processor(s) 200 may be configured to fetch and execute computer-readable instructions or processor-accessible instructions stored in a memory 202 or other computer-readable storage media.

Memory 202 is an example of computer-readable storage media for storing instructions which are executed by the processor(s) 200 to perform the various functions described herein. For example, memory 202 may generally include both volatile memory and non-volatile memory (e.g., RAM, ROM, or the like). Memory 202 may be referred to as memory or computer-readable storage media herein. Memory 202 is capable of storing computer-readable, processor-executable program instructions as computer program code that may be executed by the processor(s) 200 as a particular machine configured for carrying out the operations and functions described in the implementations herein.

Memory 202 may include one or more operating systems 204, and may store one or more applications 206. The operating system(s) 204 may be one of various known and future operating systems implemented for personal computers, audio video devices, etc. The applications 206 may include preconfigured/installed and downloadable applications. In addition, memory 202 may include data 208 to store the installed and downloaded applications. Memory 202 includes a magnetic resonance detector 210 that may be configured to receive magnetic resonance signal through a high Q coil antenna 212 (i.e., antenna 212). The magnetic resonance signal may be derived from induced magnetic resonance signal generated by presence of another wireless device.

In an implementation, the magnetic resonance detector 210 may process or detect presence of other wireless devices that are within coupling distance configured at the magnetic resonance detector 210. The coupling distance may be configured by setting a threshold for the magnetic resonance signal induced at the antenna 212. For example, the threshold may be configured to include a certain value of induced current to determine that the emitting wireless device is within the coupling distance (e.g., one meter) of the proximity sensing wireless device 102. In this example, if the induced current generated by the wireless device does not satisfy the threshold, then the wireless device is located beyond the coupling distance configured for the wireless device 102. In other implementations, the threshold may be set aside. Instead, bearing location of the wireless device 102 may be directly determined based on the received magnetic resonance signal.

In an implementation, the magnetic resonance detector 210 may detect whether the other wireless devices are located at the front or at the backside of the proximity sensing wireless device 102-1. The detection of the wireless devices 102-2 and 102-3 may be based upon a signal phase of the received magnetic resonance signal at the magnetic resonance detector 210. For example, the signal phase received by the magnetic resonance detector 210 may include a sine wave signal. In this example, the sine wave signal may indicate that the detected wireless device is located at the backside of the wireless device 102-1. At another instance, the signal phase received by the magnetic resonance detector 210 may include a cosine wave signal. The cosine wave signal may indicate that the detected wireless device is located at the front side of the wireless device 102. In other implementations, the magnetic resonance detector 210 may be configured to transmit the magnetic resonance signal to another proximity sensing wireless device.

In an implementation, the wireless device 102 may include a radio 220. The radio 220 may include a transmitter 214 that is coupled to the antenna 212. The antenna 212 may include electromagnetic coils (e.g., high quality Q antenna) that are embedded to a display (e.g. LCD) of the wireless device 102. It is to be understood that wireless device 102 may include other communication interfaces (not shown), other than the radio 220.

The example wireless device 102 described herein is merely an example that is suitable for some implementations and is not intended to suggest any limitation as to the scope of use or functionality of the environments, architectures and frameworks that may implement the processes, components and features described herein.

Generally, any of the functions described with reference to the figures can be implemented using software, hardware (e.g., fixed logic circuitry) or a combination of these implementations. Program code may be stored in one or more computer-readable memory devices or other computer-readable storage devices. Thus, the processes and components described herein may be implemented by a computer program product.

As mentioned above, computer storage media includes volatile and non-volatile, removable and non-removable media implemented in any method or technology for storage of information, such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium that can be used to store information for access by a computing device.

Example Wireless Device Locations

Figure 3:
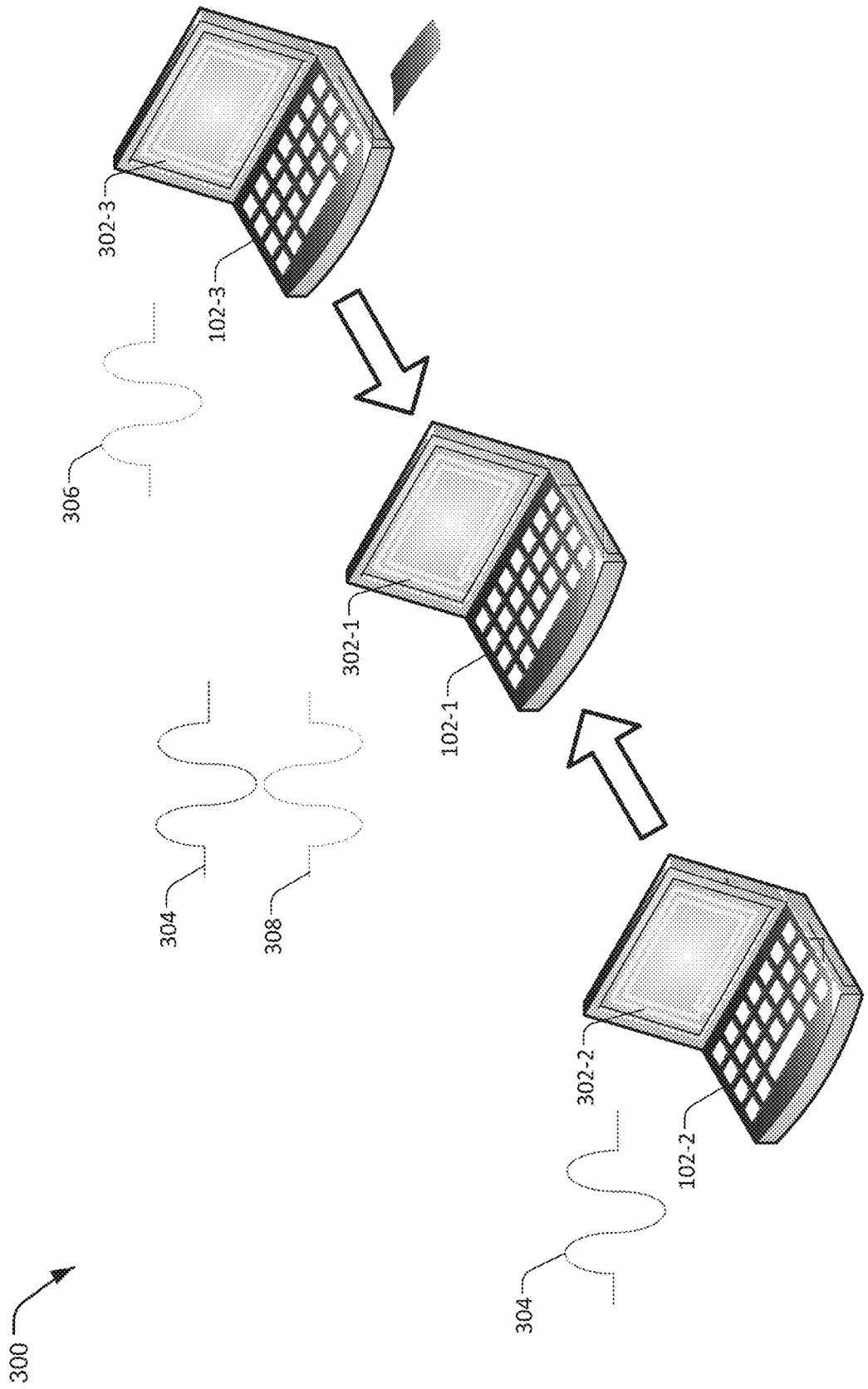
FIG. 3 is a diagram illustrating an example wireless device location settings to implement proximity detection via magnetic resonance coupling.

FIG. 3 is a diagram illustrating an example wireless device location settings 300 to implement proximity detection via magnetic resonance coupling. In an implementation, the wireless devices 102-1, 102-2, and 102-3 may be proximity sensing wireless devices. In other words, each of the wireless devices 102-1, 102-2, and 102-3 may detect the presence of each other. Further, each of the wireless devices 102-1, 102-2, and 102-3 may determine whether the other wireless devices (e.g., wireless device 102-2 and 102-3) are located at front or back side of the proximity sensing wireless device (e.g., wireless device 102-1).

In an implementation, the wireless device 102-1 is located between the wireless device 102-2, which is located at the back side of the wireless device 102-1, and the wireless device 102-3, which is located at the front side of the wireless device 102-1. In this example, the wireless device 102-1 may first determine if the wireless devices 102-2 and 102-3 are within the coupling distance as configured at the wireless device 102-1. The coupling distance may be based upon a coil diameter 302 of the antenna (e.g., antenna 212) embedded at the display (e.g., LCD) of the wireless display 102-1. After determining the physical presence of the wireless devices 102-2 and 102-3, the wireless device 102-1 may determine which of the wireless devices 102-2 and 102-3 are located at the front side or the backside of the wireless device 102-1. For example, the wireless device 102-2 may generate a sine wave signal 304 that is received by the wireless device 102-1 as the same sine wave signal 304. In this example, the received sine wave signal 304 may indicate that the generating wireless device 102-2 is located at the backside of the wireless device 102-1. Similarly, the wireless device 102-3 may generate a sine wave signal 306; however, the wireless device 102-1 may receive the sine wave signal 306 as a cosine wave signal 308 because of opposite physical location. The cosine wave signal 308 may indicate that the wireless device 102-3 is physically located at the front side of the wireless device 102-1. The received signal phases at the wireless device 102-1 are one hundred eighty degrees (180°) out of phase for the given implementation as discussed above.

Example Process

Figure 4:
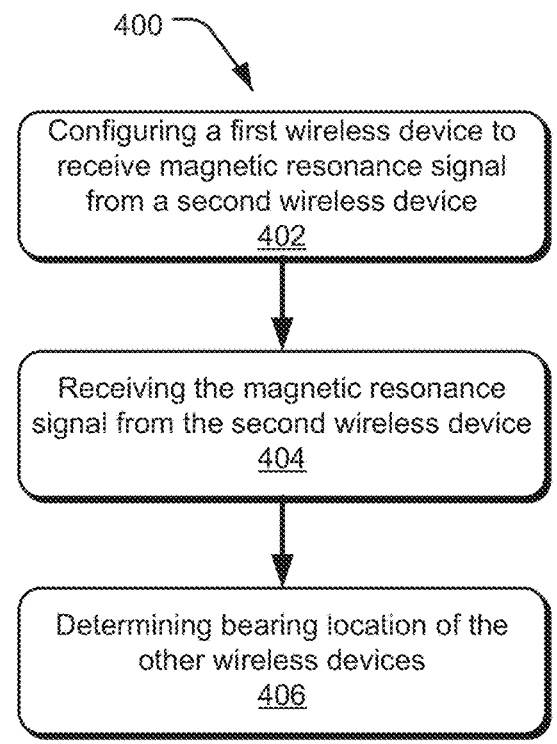
FIG. 4 is a flow chart illustrating an example method for proximity detection via magnetic resonance coupling.

FIG. 4 shows an example process chart illustrating an example method for proximity detection via magnetic resonance coupling. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention. For example, at least one computer accessible medium may perform the method described below.

At block 402, configuring a first wireless device to receive magnetic resonance signal is performed. In an implementation, the first wireless device (e.g., wireless device 102-1) may include a magnetic resonance detector component (e.g., magnetic resonance detector 210) that is configured to receive magnetic resonance signal through a high Q coil antenna (e.g., antenna 212). The antenna 212 in the first wireless device 102-1 may supply the magnetic resonance signal. The magnetic resonance signal may be derived from induced magnetic resonance signal generated by a second wireless device (e.g., wireless device 102-2). The induced magnetic resonance signal may be detected by the antenna 212 when the second wireless device 102-2 is physically located within proximity sensing distance (i.e., coupling distance) of the first wireless device 102-1.

In an implementation, the antenna 212 may be embedded at the display (e.g., LCD) of the wireless devices 102-1 and 102-2. The antenna 212 may produce a magnetic resonance coupling that is related to the antenna's dimension. For example, if the antenna 212 dimension includes a resonator of 300 millimeter (mm) coil diameter, then a maximum coupling distance may extend up to 900 mm, which is about three (3) times of the coil diameter. The maximum coupling distance may include the proximity sensing distance for the wireless device 102-1. In other implementations, the second wireless device 102-2 may be the proximity sensing wireless device.

At block 404, receiving the magnetic resonance signal is performed. In an implementation, the first wireless device 102-1 may receive the magnetic resonance signal from the second wireless device 102-2 or a third wireless device (e.g., wireless device 102-3) through the antenna 212. The magnetic resonance signal induced by the wireless devices 102-2 or 102-3 at the antenna 212 may be supplied to the magnetic resonant detector 210. In an implementation, the received magnetic resonance signal may satisfy a certain threshold that is configured at the magnetic resonance detector 210. The threshold may be used to detect physical presence of the wireless devices 102-2 and 102-3 within the configured maximum coupling distance (i.e., proximity sensing distance) for the first wireless device 102-1. For example, the second wireless device 102-2 may be physically located closer to boundary defined by the maximum coupling distance for the wireless device 102-1. In this example, a certain current may be induced at the antenna 212 that is processed by the magnetic resonant detector 210; however, the certain current may include a value that is below threshold (i.e., not resonant). As such, the below threshold value may indicate that the second wireless device 102-2 is located beyond the maximum coupling distance. In an implementation, the threshold value configured at the magnetic resonance detector 210 may include electrical resonance that induces maximum current at the antenna 212.

At block 406, determining bearing location of the wireless device based on a signal phase of the received magnetic resonance signal is performed. In an implementation, the wireless device 102-1 may determine whether the wireless devices 102-2 and 102-3 are physically located at front location or back location of the proximity sensing first wireless device 102-1. In an implementation, if the second wireless device 102-2 is located at a back side of the first wireless device 102-1, then the first wireless device 102-1 may receive the magnetic resonance signal that includes a sine wave signal. However, if the second wireless device 102-2 is located at a front side of the first wireless device 102-1, then the first wireless device 102-1 may receive the magnetic resonance signal that includes a cosine wave signal due to opposite location of the second wireless device 102-3. In other words, the wireless device (e.g., wireless device 102-1) that is located at the middle of two other wireless devices 102-2 and 102-3 may receive two respective magnetic resonance signals that are one hundred eighty (180) degrees out of phase from one another.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

The invention claimed is:

1. A method of proximity detection via magnetic resonance coupling comprising:
configuring a first wireless device that includes a processor, and receiver to receive magnetic resonance signal from a second wireless device;
determining bearing location of a second wireless device based on a signal phase of the received magnetic resonance signal, wherein the bearing location includes the second wireless device to be physically located at front side or at backside of the first wireless device, wherein the signal phase received from the second wireless device located at the backside of the first wireless device is one hundred eighty degrees (180°) out of phase with the signal phase received when the second wireless device is located at the front side of the first wireless device; and
providing the bearing location to a user.

2. The method of claim 1, wherein the configuring includes setting maximum coupling distance, which is based on a coil diameter of high quality (Q) factor antenna embedded at a display of the first wireless device, for proximity sensing range of the first wireless device.

3. The method of claim 1, wherein the configuring includes setting a threshold for the magnetic resonance signal to indicate presence of the second wireless device within a configured maximum coupling distance.

4. The method of claim 1, further comprising receiving an induced sine wave signal from the second wireless device that is physically located at the backside of the first wireless device.

5. The method of claim 1, further comprising receiving an induced cosine wave signal from the second wireless device that is physically located at the front side of the first wireless device, wherein the cosine wave signal is derived from a sine wave signal generated by the second wireless device due to opposite physical location.

6. A first wireless device comprising:
one or more processors;
memory configured to the one or more processors;
a magnetic resonance detector that is configured to receive magnetic resonance signal from a second wireless device, wherein bearing location of the second wireless device is determined by a signal phase of the received magnetic resonance signal, the bearing location is to indicate that the second wireless device to be physically located at front side or at back side of the first wireless device; and
a high quality factor (Q) coil antenna that supplies the magnetic resonance signal to the magnetic resonance detector based on the magnetic resonance signal induced by the second wireless device, wherein the signal phase received from the second wireless device located at the backside of the first wireless device is one hundred eighty degrees (180°) out of phase with the signal phase received when the second wireless device is located at the front side of the first wireless device.

7. The first wireless device of claim 6, wherein the magnetic resonance detector is configured to indicate a maximum coupling distance, which is based at least in part on a coil diameter of high quality (Q) factor antenna embedded in a display of the first wireless device, for proximity sensing range of the first wireless device.

8. The first wireless device of claim 6, wherein the magnetic resonance detector is configured to include a threshold that indicates presence of the second wireless device within a configured maximum coupling distance.

9. The first wireless device of claim 6, wherein the magnetic resonance detector includes receiving an induced sine wave signal from the second wireless device that is physically located at the backside of the first wireless device.

10. The first wireless device of claim 6, wherein the magnetic resonance detector includes receiving an induced cosine wave signal that is derived from a sine wave signal generated by the second wireless device that is physically located at the front side of the first wireless device.

11. A high quality (Q) factor coil antenna embedded in a display of a first wireless device, comprising the coil antenna to supply a detected magnetic resonance signal to a magnetic resonance detector, which detects bearing location of a second wireless device that induced the magnetic resonance signal to the high Q coil antenna, wherein the bearing location of the second wireless device is determined by a signal phase of the supplied magnetic resonance signal, the bearing location includes the second wireless device to be physically located at front side or at backside of the first wireless device, wherein the signal phase received from the second wireless device located at the backside of the first wireless device is one hundred eighty degrees (180°) out of phase with the signal phase received when the second wireless device is located at the front side of the first wireless device.

12. The antenna of claim 11, wherein the coupled magnetic resonance detector is configured to indicate a maximum coupling distance, which is based at least in part on a coil diameter of the coil antenna, for proximity sensing range of the first wireless device.

13. The antenna of claim 11, wherein the induced magnetic resonance signal includes a sine wave signal from the second wireless device that is physically located at the backside of the first wireless device.

14. The antenna of claim 11, wherein the induced magnetic resonance signal includes a cosine wave signal from the second wireless device that is physically located at the front side of the first wireless device.

* * * * *